United States Patent [19]

Dietrich

[11] Patent Number: 4,847,489
[45] Date of Patent: Jul. 11, 1989

[54] LIGHT SENSITIVE SUPERLATTICE DETECTOR ARRANGEMENT WITH SPECTRAL SENSITIVITY

[75] Inventor: Klaus Dietrich, Gochsheim/Uber Schweinf, Fed. Rep. of Germany

[73] Assignee: Messerschmitt-Bölkow-Blohm GmbH, Munich, Fed. Rep. of Germany

[21] Appl. No.: 175,107

[22] Filed: Mar. 30, 1988

[30] Foreign Application Priority Data

Apr. 1, 1987 [DE] Fed. Rep. of Germany ....... 3710986

[51] Int. Cl.$^4$ .................... G01J 3/50; H01L 27/14
[52] U.S. Cl. .................... 250/226; 250/578; 358/44; 357/30
[58] Field of Search .......... 250/226, 578; 357/30 H, 357/30 E, 30 L, 4, 45; 358/44, 48

[56] References Cited

U.S. PATENT DOCUMENTS

| 3,882,533 | 5/1975 | De,uml/o/ hler | 357/58 |
| 4,255,760 | 3/1981 | Zeitzoff et al. | 358/44 |
| 4,481,522 | 11/1984 | jastrzebski et al. | 358/44 |
| 4,514,755 | 4/1985 | Tabei | 358/44 |
| 4,561,005 | 12/1985 | Shannon | 357/4 |
| 4,613,895 | 9/1986 | Burkey et al. | 358/48 |
| 4,677,289 | 6/1987 | Nozaki et al. | 250/578 |
| 4,716,449 | 12/1987 | Miller | 357/30 E |
| 4,728,997 | 3/1988 | Szydlo et al. | 250/578 |

FOREIGN PATENT DOCUMENTS 0292973 12/1986 Japan ..................... 357/4

OTHER PUBLICATIONS

Döhler, "Solid–State Superlattices", *Scientific American* 11/83, pp. 144–151.

Döhler, "Doping Superlattices" *J. Vac. Sci. Technol.*, 16(3), May/Jun. 1979, pp. 851–856.

Primary Examiner—David C. Nelms
Assistant Examiner—Michael Messinger
Attorney, Agent, or Firm—Kenyon & Kenyon

[57] ABSTRACT

A light sensitive detector arrangement contains a plurality of photosensitive detector elements, which in each instance have a multilayer structure of alternating positively and negatively doped photosensitive semiconductor material with a superlattice structure and control electrodes arranged vertically to the semiconductor layers and bordering on them on their front faces. To these a control voltage can be applied in order to control the spectral light sensitivity. An array contains in each case a predetermined number (for example three) of photo detector groups ($E_{11}$ to $E_{mm}$) of photosensitive detector elements ($E_{111}$, $E_{112}$, $E_{113}$... respectively $E_{mm1}$, $E_{mm2}$, $E_{mm3}$). The control electrodes of the photo detector elements of each photo detector group are connected to variable voltage regulators ($U_1$, $U_2$, $U_3$). Through the voltage regulators the upper and/or lower limit wavelength ($\lambda_o$, $\lambda_u$) of the photo detector elements of the discrete photo detector groups can be set differently and graded with respect to each other. A filter arrangement is provided having high pass or low pass function, the filter edge ($\lambda_F$) of which subdivides the spectral range of the discrete photo detector elements of the photo detector groups into an upper or lower effective spectral range ($\lambda_F$–$\lambda_{o3}$, $\lambda_F$–$\lambda_{o2}$, $\lambda_F$–$\lambda_{ol}$). Differential amplifiers can be driven with the signals of the photo detector elements of each photo detector group, the inputs of which can be driven by the spectral signals of the outputs of two adjacent photo detector elements, such that at the outputs of the differential amplifiers differentiable selected spectral signal responses occur.

7 Claims, 3 Drawing Sheets

FIG. 5
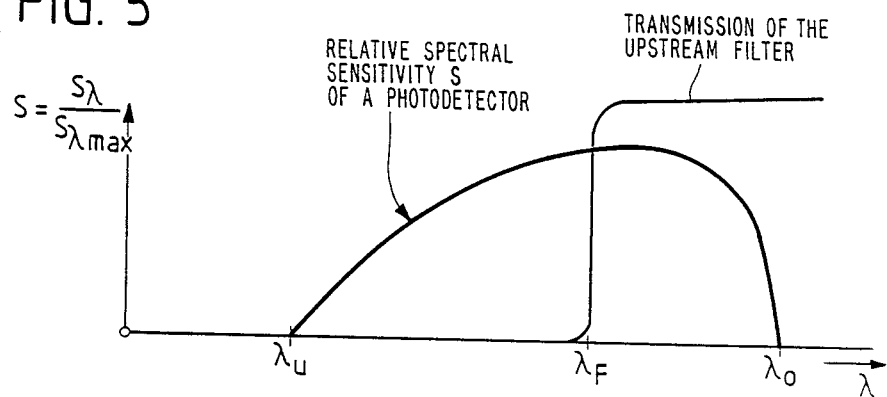
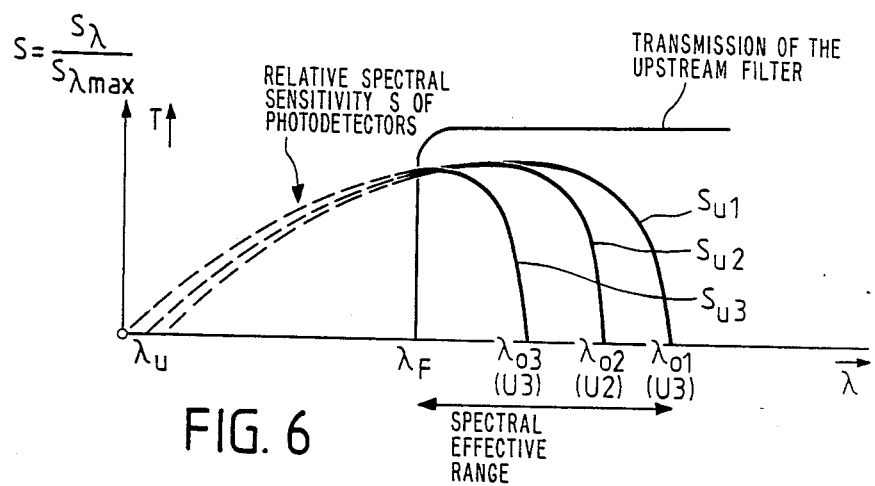
FIG. 6
FIG. 7
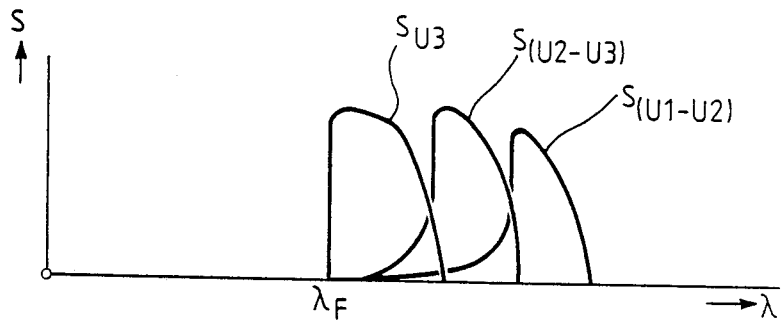

LIGHT SENSITIVE SUPERLATTICE DETECTOR ARRANGEMENT WITH SPECTRAL SENSITIVITY

BACKGROUND OF THE INVENTION

The present invention relates to a light sensitive detector arrangement having a plurality of photosensitive detector elements, the detector elements having a multilayer structure of alternating positively and negatively doped photosensitive semiconductor material with a super lattice structure and control electrodes arranged vertically and bordering on them on the front faces, to which a control voltage can be applied in order to control the spectral light sensitivity.

Such light sensitive detector arrangements frequently use gallium arsenide doped superlattices, which are arranged on a semi-insulating gallium arsenide substrate, use silicon for the n-doping and beryllium for the p-doping. The electrodes bordering on the discrete layers have n+ and p+ regions. The turnover bias voltage applied to these electrodes effects a predetermined spectral range, which fluctuates as a function of the magnitude of the control voltage.

Known image recording systems with color and black-and-white photo sensors have vidicon tubes or silicon CCD arrays, with the latter, as a rule, having photo elements arranged in rows and columns, the signal contents of which are supplied to charge-coupled arrangements.

Known black-and-white image sensors have the disadvantage that their spectral sensitivity is predetermined by the detector material used. Changing the spectral sensitivity is, as a rule, only possible by series connecting optical filters. If the spectral sensitivity of an electronic image recording system is to be changed rapidly, then, as a rule, a rapid filter change is necessary. To do this, mechanical parts are required, which swing the not-required filters out of the way and the required filter in front of the light sensitive converter arrangement. Such mechanical parts, due to the expenditures and degradation in response, are disadvantageous. Several image sensor systems are known, which comprise a plurality of photosensitive detector elements. Each array of such light sensitive detector element has a predetermined spectral characteristic. If the spectral characteristic is to be changed, an array of the photo sensitive detector elements is to be replaced by a second array with an appropriately different spectral characteristic. It is conceivable that different spectral filters are used in order to generate different spectral characteristics. Such systems, which are realized in semiconductor technology as well as also in tube technology, due to their high cost and elaboration, are disadvantageous.

Light sensitive detector arrangements are known, in which a single image sensor is used, with which a color strip filter is connected in series with, for example, red sensitivity, blue sensitivity, and green sensitivity. The discrete filter ranges alternate with each other and have, in each instance, the size of a photosensitive detector element (pixel). In this connection, there are color strip image dissectors (color stripe vidicon) and color strip CCD arrays. To each CCD photosensitive pixel in such color strip CCD arrays corresponds a color filter, which is preferentially applied on the CCD pixel.

Such semiconductor CCD arrays with series connected filters have the disadvantage that for each picture element (pixel) on the semiconductor chip, a very thin color filter, the thickness of which is approximately 10 um and having the required absorption coefficient and spectral response, must be applied. Such color filter techniques require a heat-stable and non-aging application of this filter strip on the CCD array. The danger exists that errors and fluctuations can occur regarding temperature and long-term stability of these filter layers. In addition, problems regarding the highest absorption and transmission with respect to the very thin color filter layer can arise. A light sensitive detector arrangement of the above mentioned kind is known from the literature Applied Physics A 37, 1985, pages 47 to 56, but this reference does not suggest creating largely separated spectral sensitivity ranges for electronic color image recording technology.

SUMMARY OF THE INVENTION

It is, therefore, an object of the present invention to provide a light sensitive detector arrangement of the above mentioned kind, the controllable spectral sensitivity response of which is to be utilized for color sensitive detector arrangements for electronic color image recording systems, with the light sensitive detector arrangement not requiring color strip filters upstream of the optoelectronic converters. Additionally, the spectral sensitivity compared to known electronic image recording systems is to be improved.

The above and other objects of the invention are achieved by a light sensitive detector arrangement having a plurality of photosensitive detector elements, the detector elements each having a multilayer structure of alternating positively and negatively doped photosensitive semiconductor material with a superlattice structure and control electrodes arranged vertically with respect to the semiconductor layers and bordering on them on their front faces, the control electrodes being adapted to receive a control voltage in order to control the spectral light sensitivity, an array of a predetermined number of the photo detector groups having photosensitive detector elements being provided, the control electrodes of the photo detector elements of each photo detector group being connected to variable voltage regulators, at least one of upper and lower limit wavelengths of the photo detector elements of the discrete photo detector groups being set differently via the voltage regulators, and being graded with respect to each other, a filter arrangement having a high pass and low pass function being provided upstream of the array of the photo detector groups, the filter arrangement having a filter edge which divides the spectral range of the discrete photo detector elements of the photo detector groups into an upper or lower effective spectral range, differential amplifiers being driven by the signals of the photo detector elements of each photo detector group, inputs of the differential amplifiers being driven by the spectral signals of outputs of two adjacent photo detector elements, such that at outputs of the differential amplifiers, differentiable selected spectral signal responses occur.

This presents the advantage that through the use of photo sensitive semiconductors without color strip filters with superlattice structure, preferentially of gallium arsenide doped superlattices, given the appropriate control of the discrete photo detector elements after difference formation of adjacent overlapping spectral signal responses, desired selected spectral ranges are created, which are suitable, in particular, for color image processing. A further advantage can be seen in that through setting of all control voltages to a predetermined level, homogeneous color impressions with correspondingly increased sensitivity can be generated. Through the choice of this control voltage it is readily possible to change a light sensitive detector arrangement—otherwise used for color image processing—into a black-and-white detector arrangement of higher sensitivity. Furthermore, temperature and long-term stability of the detector arrangement is ensured since additional strip filters do not need to be used. A further advantage consists in that no sacrifices of spectral sensitivity are made.

One-dimensional or two-dimensional arrays of photosensitive detector elements are conveniently provided, which are each subdivided into subgroups. The spectral characteristic and sensitivity is the same for all photosensitive detector elements. This simplifies and facilitates their manufacture. The spectral characteristic is changed solely by the choice of control voltage.

Further advantageous designs are found in the secondary claims. It is conceivable that the control voltages for the photo detector elements of each photo detector group are so selected and their signal output voltages are influenced in the differential amplifiers and in processing stages such that the spectral signal responses in each instance border on each other.

The output signal of the photo detector element with the spectral signal response, the maximum limit wavelength of which is closest to the filter edge wavelength, is advantageously evaluated without difference formation.

The light sensitive detector arrangement can advantageously be coupled to a microcomputer, which in the course of the control program transfers the individual signal values of the image recording elements to a read and write storage.

According to an advantageous special design, the selection circuit for the photo detector groups contains a multiplexer, through which all photo detector elements of the array can be sequentially driven by each of the discrete control voltages. Simultaneously, the light-dependent output signals can be stored in the read and write storage device. The individual differential amplifiers are inserted after the read and write storage.

BRIEF DESCRIPTION OF THE DRAWINGS

The invention will be described in the following detailed description with reference to the drawings in which:

FIG. 5 shows the spectral characteristic of a light sensitive detector as well as the characteristic of a filter connected upstream;

FIG. 6 shows the spectral sensitivity characteristic of three differently driven photosensitive detector elements; and FIG. 7 shows the spectral sensitivity response of three spectral ranges after appropriate evaluation.

DETAILED DESCRIPTION

Figure 1:
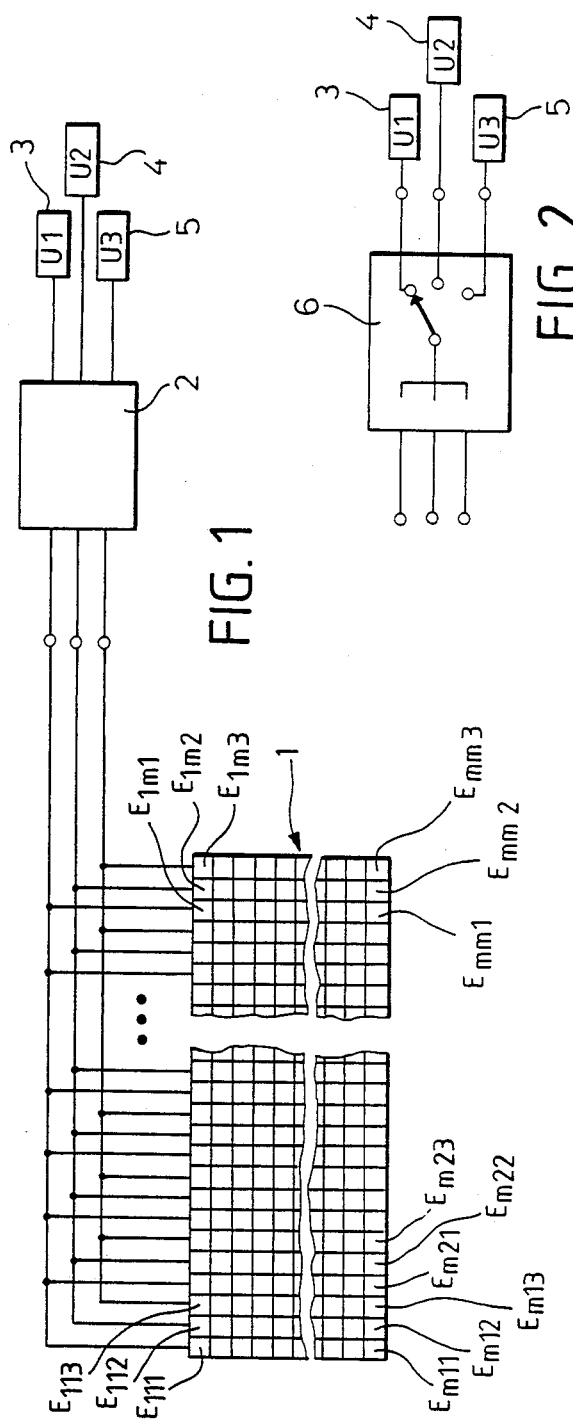
FIG. 1 shows a schematic representation of a photosensitive detector device, which comprises image recording elements consisting of rows and columns.
Figure 1A:
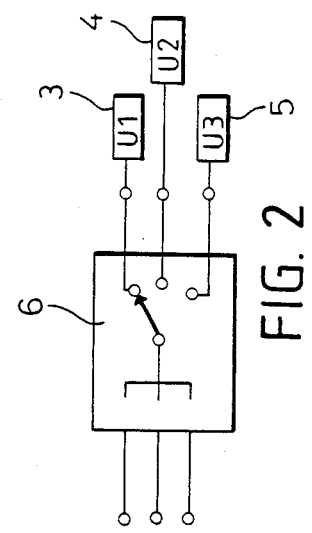
FIG. 1a shows a photosensitive detector row.

According to FIG. 1, reference numeral 1 refers to a light sensitive detector arrangement, which has a plurality of photosensitive detector elements E111, E112, E113 . . . E1m1, E1m2, E1m3, . . . Em11, Em12, Em13; Em21, Em22, Em23 . . . and Emm1, Emm2, Emm3. Three adjacent photosensitive detector elements (pixels) as is apparent in FIG. 1a - are assigned to one photo detector group. For example, the pixels E111, E112, and E113 are assigned to the photo detector group E11. The corresponding is true for the additional adjacent pixel elements.

In FIG. 1 the discrete photosensitive detector elements or pixels are arranged in rows and columns. They are components of a photosensitive CCD array or arrangement. Reference numeral 2 designates a drive circuit, which on the input side is connected to voltage regulators 3, 4, and 5. The voltage regulator 3 supplies the input voltage U1, while the voltage regulators 4 and 5 supply the control voltage U2 and U3. A first output of the selection circuit 2 is connected with the first pixel column of each photo detector group. The second output of the selection circuit 2 is connected with the second column of the pixel elements of each photo detector group, while the third output of the selection circuit 2 is connected with the third column of the pixel elements of each photo detector group.

The pixel elements of the last photo detector group E1m of the first row are referred to by E1m1, E1m2 and E1m3. The pixel elements of the first photo detector group of the last row are designated Em11, Em12, Em13, while the pixel elements of the last photo detector group of the last row have the reference labels Emm1, Emm2, and Emm3.

The drive circuit 2 is designed so that it supplies the corresponding pixel elements with the intended control voltage in order to generate a relative spectral sensitivity response as is shown, for example, in FIG. 6.

Figure 2:
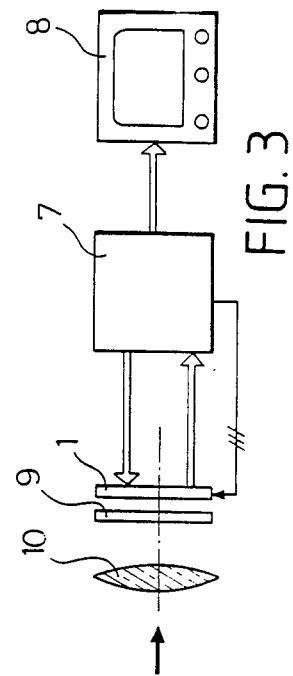
FIG. 2 shows a multiplex-like selection circuit for the light sensitive detector arrangement.

But it is also conceivable to build a drive circuit 6 according to FIG. 2 in the manner of a time division multiplexer such, that in a first mode the control voltage U1 is applied to all pixel elements, that in a second phase—instead of this first control voltage U1—a second control voltage U2 is applied, and that, subsequently, in a third mode the control voltage U3 is switched effective.

This means that sequentially for all pixel elements in each instance identical spectral sensitivity response is present with the advantage that the resolution is correspondingly increased.

Figure 3:
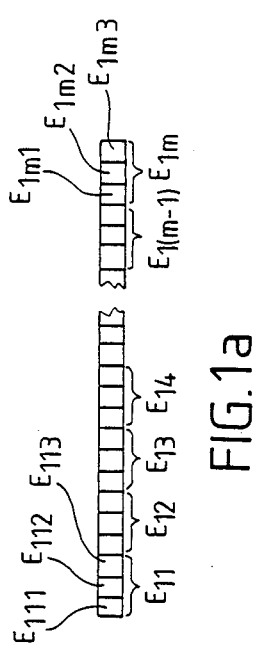
FIG. 3 shows a schematic representation of the light sensitive detector arrangement with connected parts.

According to FIG. 3, in which parts corresponding to parts in FIG. 1 are given the same reference numbers, the light sensitive detector device 1 is connected to an electronic evaluation circuit 7, to which, in turn, a monitor 8 is connected. The light sensitive detector arrangement 1 is connected upstream to filter 9, which has a predetermined filter edge, as is particularly clearly evident in FIGS. 5 and 6. Optics connected in series upstream are labeled 10.

Figure 4:
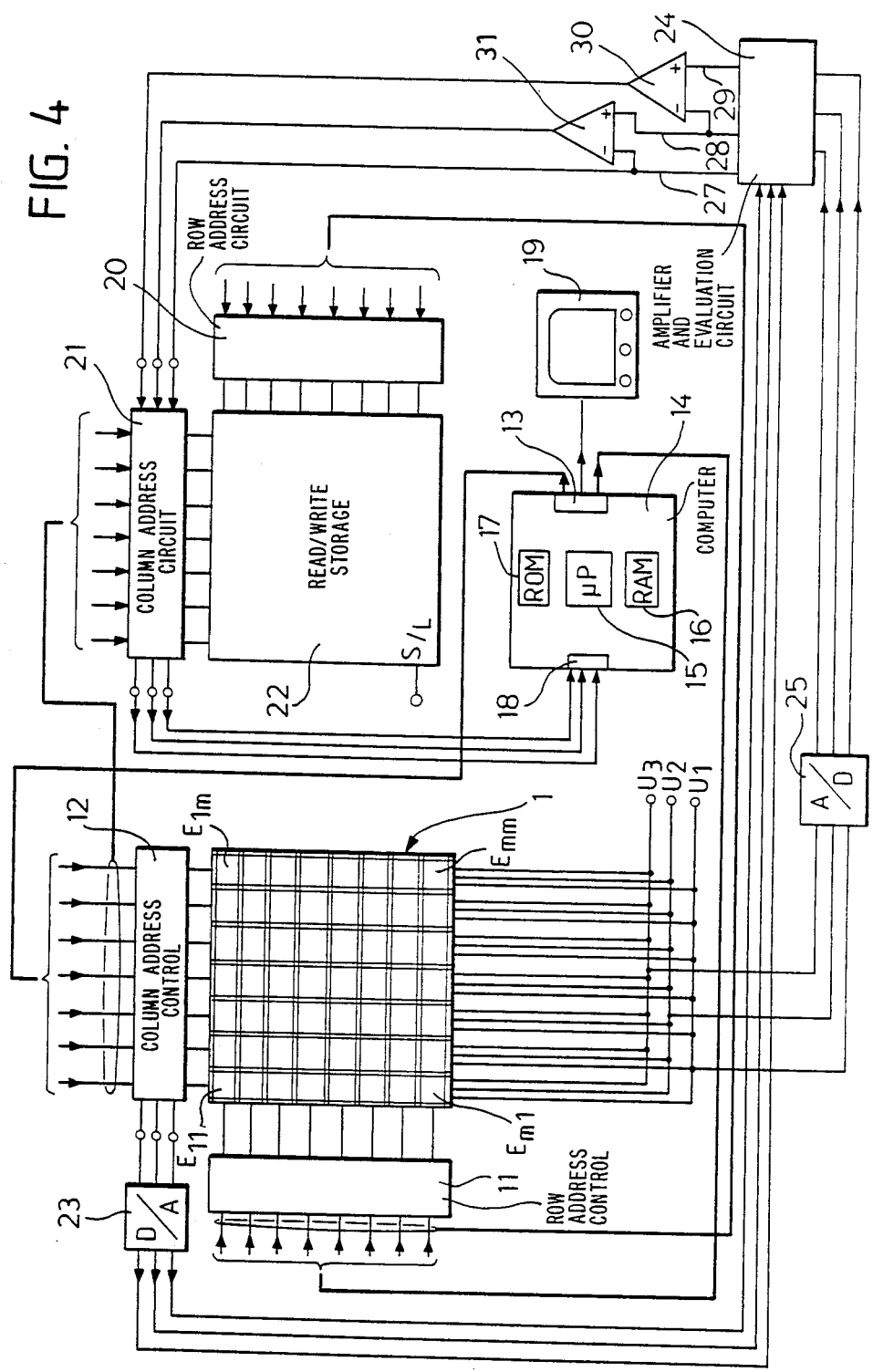
FIG. 4 shows a schematic circuit arrangement of the light sensitive detector arrangement.

In FIG. 4 the parts corresponding to parts in FIG. 1 are provided with the same reference numbers. The photosensitive detector device 1 contains the photo detector groups E11 . . . , E1m . . . , Em1 . . . , Emm. They are structured and arranged as can be seen in FIG. 1. The control voltages U1, U2, and U3 are supplied to the individual photo detector groups of the rows.

Reference numeral 11 designates an address signal control circuit for the individual rows, while reference numeral 12 designates an address control circuit for the individual columns of the photo detector groups. The address control signals are received by an output stage 13 of a microcomputer 14, which has a microprocessor 15, a read and write storage device 16, a program constant storage 17, and an input circuit 18. The output stage 13 is, in addition, connected to a monitor 19. The address control signals for the columns and rows of the light sensitive detector device are supplied in addition to the address control circuits 20 and 21 for a read and write semiconductor storage 22. This read and write storage 22 has columns and rows, which correspond to the light sensitive detector device.

The light sensitive detector device 1 with its photosensitive groups is a component of a CCD arrangement.

The address control circuit 12 for the columns contains an output circuit, across which a control connection to an analog to digital converter 23 is established by way of three output lines. From this analog to digital converter 23 three signal connections lead to an amplifier and evaluation circuit 24, in which the digital image signals are processed. The amplifier and evaluation circuit 24 is driven, in addition, by three control signals, which are received by an analog to digital converter 25, the inputs of which are connected to the control voltages U1, U2, U3.

Corresponding to the number of pixels per photosensitive groups, namely three, at the output of the amplification circuit 24, three spectral channels are available. The spectral channel 27 leads directly to the data input stage of the address circuit 21. The second spectral channel 28 leads to a first input of a differential amplifier 29, the second input of which is connected with the first channel 27. The output of this operational amplifier 29 leads to the second data input of the data receiving stage of the address circuit 21.

The third spectral channel 29 is connected with the first input of an additional differential amplifier 30, the second input of which is connected to the second spectral channel. The output of this operational amplifier 30 leads to the third data input of a data receiving stage of the addressing circuit 21.

The addressing circuit 21, furthermore, has a data output stage, which is connected to the input stage 18 of the microcomputer 14 across three data lines.

In FIG. 5 it is apparent that the filter 9 connected upstream of the photosensitive detector device 1 has a filter edge, which is associated with an edge wavelength $\lambda_F$. The transmission range of the upstream filter 9 subdivides the relative spectral sensitivity curve S of each photosensitive detector of the photosensitive detector arrangement 1 into an upper and a lower spectral range. In the present case the effective spectral range of each photosensitive detector is between the filter edge $\lambda_F$ and the upper or maximum wavelength value $\lambda_o$ or $\lambda_u$. The lower spectral range is filtered out.

In FIG. 6 different spectral sensitivity characteristics Su1, Su2, Su3 are shown. These different spectral characteristics have maximum wavelengths $\lambda_{o1}$, $\lambda_{o2}$, and $\lambda_{o3}$. The spectral effective range is between $\lambda_F$ and $\lambda_{o1}$.

The signals of the individual photosensitive detectors are supplied across the amplifier circuit 24 to the differential amplifiers 29 and 30. The characteristics shown in FIG. 6 are present in digital form at the output of the amplifier circuit 24.

At the input of the input stage of the addressing circuit 21 spectral characteristics are obtained in digital form, such as are shown in FIG. 7. Through further signal processing the discrete selected spectral characteristics can be differentiated from each other even more clearly. Consequently, through the choice of the control voltages U1, U2, and U3 as well as through the choice of the filter edge $\lambda_F$ of the series filter, wanted spectral sensitivity responses are obtained, which for color image processing are not only suitable but also particularly advantageous. The essential advantages of this light sensitive detector device rests in the fact that without using series-connectable filter strips, the spectral sensitivity, the number of spectral channels, the position of the spectral channels, and the resolution of the light sensitive detector device are variable. It is conceivable that the sequence of driving the discrete photo detector elements can be changed through the suitable choice of the control voltage. In this manner the color sequence in each photo detector group can be changed correspondingly.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A light sensitive detector arrangement having a plurality of photosensitive detector elements, each detector element having a multilayer structure of alternating positively and negatively doped photosensitive semiconductor material with a superlattice structure and having control electrodes arranged vertically with respect to the semiconductor layers and bordering on the semiconductor layers on front faces thereof, the control electrodes being adapted to receive a control voltage in order to control the spectral light sensitivity of the detector arrangement, an array of a predetermined number of the photo detector groups having photosensitive detector elements being provided, the control electrodes of the photo detector elements of each photo detector group being connected to variable voltage regulators, at least one of upper and lower limit wavelengths of the photo detector elements of the discrete photo detector groups being set differently via the voltage regulators and being graded with respect to each other, a filter arrangement having a high pass and low pass function being provided upstream of the array of the photo detector groups, the filter arrangement having a filter edge which divides the spectral range of the discrete photo detector elements of the photo detector groups into an upper or lower effective spectral range, differential amplifiers being driven by the signals of the photo detector elements of each photo detector group, inputs of the differential amplifiers being driven by spectral signals of outputs of two adjacent photo detector elements, such that at outputs of the differential amplifiers, differentiable selected spectral signal responses occur.

2. The light sensitive detector arrangement recited in claim 1, wherein control voltages for the photo detector elements of each photo detector group are selected and signal output voltages of the differential amplifiers and in processing stages influenced such that the spectral signal responses border on each other.

3. The light sensitive detector arrangement recited in claim 1, wherein the control voltages are supplied to the photo detector elements across a drive circuit.

4. The light sensitive detector arrangement recited in claim 1, wherein an output signal of the photo detector element with a spectral signal response whose maximum limit wavelength is most closely adjacent to the filter edge wavelength is evaluated without formation of difference.

5. The light sensitive detector arrangement recited in claim 1, further comprising an addressable semiconductor storage means associated with the array of the photo detector groups, said storage means being operationally connected to a microcomputer.

6. The light sensitive detector arrangement recited in claim 5 wherein the storage means comprises a read and write storage means.

7. The light sensitive detector arrangement recited in claim 6, wherein the drive circuit comprises a multiplexer by which all photo detector elements of the array are sequentially drivable by each of the discrete control voltages and simultaneously the light-dependent output signals are storable in the read and write storage means, the differential amplifier being connected downstream from the read and write storage means.

* * * * *